United States Patent [19]
Gomez

[11] Patent Number: 5,976,897
[45] Date of Patent: Nov. 2, 1999

[54] METHOD OF PROTECTING DEVICE LEADS OF A PACKAGED INTEGRATED CIRCUIT

[75] Inventor: Carlos A. Gomez, Austin, Tex.

[73] Assignee: Advanced Micro Devices, Inc., Sunnyvale, Calif.

[21] Appl. No.: 08/948,921

[22] Filed: Oct. 10, 1997

[51] Int. Cl.$^6$ .................................................... H01L 21/66
[52] U.S. Cl. ............................ 438/4; 438/15; 29/426.1; 29/426.4; 29/762
[58] Field of Search .................................. 438/4, 15, 800; 257/705; 29/426.1, 426.4, 762

[56] References Cited

U.S. PATENT DOCUMENTS

| | | | |
|---|---|---|---|
| 4,089,704 | 5/1978 | Heiss et al. | 134/29 |
| 5,367,762 | 11/1994 | Disko et al. | 29/764 |
| 5,424,254 | 6/1995 | Damiot | 438/4 |
| 5,477,099 | 12/1995 | Brendeck et al. | 257/704 |

*Primary Examiner*—Olik Chaudhuri
*Assistant Examiner*—Michael Dietrich
*Attorney, Agent, or Firm*—Skjerven, Morrill, MacPherson, Franklin & Friel LLP

[57] ABSTRACT

Device leads on a packaged integrated circuit are protected during a decapsulation process. A composite material such as wax is applied to coat the leads. At least a portion of a package containing the integrated circuit is then removed while the composite material is coating the leads, the coated leads being protected from fumes associated with the decapsulation process and less susceptible to deformation during handling. The composite material is then removed from the leads after the portion of the package is removed from the packaged device.

14 Claims, 1 Drawing Sheet

METHOD OF PROTECTING DEVICE LEADS OF A PACKAGED INTEGRATED CIRCUIT

BACKGROUND OF THE INVENTION

1. Field of the Invention

This invention relates to analysis of integrated circuit devices and, more particularly, to protection of device pins during that analysis.

2. Description of the Related Art

In order to analyze packaged integrated circuit devices, to determine, for example, the nature and causes of a device failure, it is often necessary to remove a portion of the package in which the integrated circuit resides in order to gain access to the integrated circuit contained within the integrated circuit package. Such a process is known as a device "decapsulation" or "decapping" process. For integrated circuits packaged in plastic packages, in order to remove a portion of a package, the decapsulation process uses nitric acid to etch away a portion of the plastic package. However, the leads of the packaged device may be damaged by exposure to the nitric acid utilized in the decapping process. The nitric acid can cause the leads to disintegrate rendering the part untestable. In addition, the nitric acid can caused the leads to be oxidized to the extent that the leads require cleaning before the part may be tested. High pin count devices, such as those that may be packaged in, e.g., thin quad flat packs (TQFPs), are very susceptible to such damage.

In addition to the problems associated with exposure to nitric acid, as device pin counts increase and device sizes continue to decrease, the leads or pins of the devices have become less tolerable to handling and, thus, there is an increased likelihood of deforming the device pins and rendering the part untestable when the part is subject to the decapping process. That is, as device pin counts continue to grow and geometries continue to shrink, device pins have become more fragile. It would be desirable to provide a way to protect the device leads from the nitric acid employed during the decapping process as well as make the device pins less susceptible to deformation during the decapping process.

SUMMARY OF THE INVENTION

Accordingly, a method has been discovered to protect the leads during the decapsulation process. In one embodiment of the invention, a method of protecting device leads on an integrated circuit includes applying a composite material to the leads. The composite material may be, for example, a wax or paraffin. At least a portion of a package containing the integrated circuit is removed in a decapsulation process while the composite material is coating and thus protecting the leads. The composite material is then removed from the leads after the portion of the package has been removed from the packaged device.

BRIEF DESCRIPTION OF THE DRAWINGS

The present invention may be better understood, and its numerous objects, features, and advantages made apparent to those skilled in the art by referencing the accompanying drawings.

DESCRIPTION OF THE PREFERRED EMBODIMENT(S)

Figure 1:
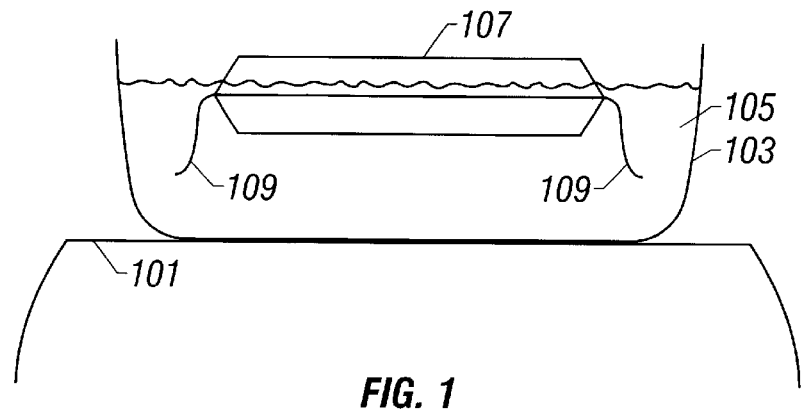
FIG. 1 shows a packaged integrated circuit device immersed in a container of hot wax.

Referring to FIG. 1, packaged integrated circuit device 107, which may be, e.g., a 160 pin gull wing surface mount plastic quad flat pack (PQFP), or other plastic packaged integrated circuit, is immersed in a container 103 of hot wax 105. In one embodiment of the invention, container 103 may be formed of aluminum foil which should be large enough to accommodate and deep enough to allow melted wax to cover the leads 109. The wax is preferably a high temperature wax such as bees wax or a high temperature paraffin meaning the melting temperature of the paraffin is high. The container 103 containing wax 105 and integrated circuit 107 is placed on hot plate 101 or other source of heat. The wax in the tray in container 103 melts as heat is imparted onto the container from heat source 101. Once the wax has melted and it is ensured that enough wax material has been added to reach slightly above the leads but below the top of the part, as shown in FIG. 1, container 103 can be removed from the hot plate and the wax can be allowed to solidify. The device does not need to be in the container as the wax is melted. Device 107 and wax 105, now solidified, can be removed from container 103. Excess wax should be removed from integrated circuit 107. That can be accomplished with a sharp blade.

At this point, the leads 109 of device are encapsulated in wax giving pins 109 added rigidity and thus more resistance to deformation due to handling during the decapping process. The wax thus functions as an external composite that coats, stiffens, and protects the leads. Once the wax has been solidified on the leads, the normal decapping process can now be performed. An exemplary decapping process, which is known in the art, may use the ETAC-XISC PA 102 plastic mold decapsulation system or the B&G International Model No. 250. Using such a system, a portion of the package of integrated circuit 107, e.g., the lid or top portion, is etched away using red fuming nitric acid to provide access to the integrated circuit within, for device analysis. Other methods of decapping the packaged device can be used. For example, the nitric acid can be applied by hand with an eye dropper. Note that once the devices leads are encapsulated in the wax, the pins are also more resistant to the fumes of the red fuming nitric acid.

The temperature of the red fuming nitric acid used in the exemplary decapping process is approximately 72° C. The high temperature has wax or high temperature paraffin or other composite material used should preferably have a melting point above the temperature of the nitric acid used in the decapping process to ensure that the wax continues to protect the leads during the decapping process. In order alter the thermal characteristic of the wax applied to the package leads, e.g., to raise the melting temperature of the wax, beads of wax having a higher melting temperature can be added to other wax to create a wax with a sufficiently high temperature to withstand the temperature of the nitric acid utilized in the decapsulation process.

Once the decapping process is complete, several ways may be used to remove the wax. For example, according to one wax removal approach, acetone and an ultra sonic cleaner are employed. The ultra sonic cleaner may be the American Beauty 9910 or the Branson 5200 or 1200. Other cleaners, for instance, isopropyl alcohol, may also be used. Alternatively, heat may be applied to melt the wax or a mixture of water and a conventional cleaner such a "FORMULA 409" available from the Clorox Co., may be used to remove the wax. In fact, any citric-based cleaner can be effectively employed to remove the wax from integrated circuit device 107.

While the composite material has been described as a high temperature wax or a high temperature paraffin, other composite material may also be employed. If other composite material is used, it should be able to coat the pins of the packaged electronic device sufficiently to provide protection, should be impervious to the nitric acid and/or other substances used during the decapsulation process at the temperatures used during the decapsulation process and preferably, should also provide added resistance to pin deformation.

Figure 2:
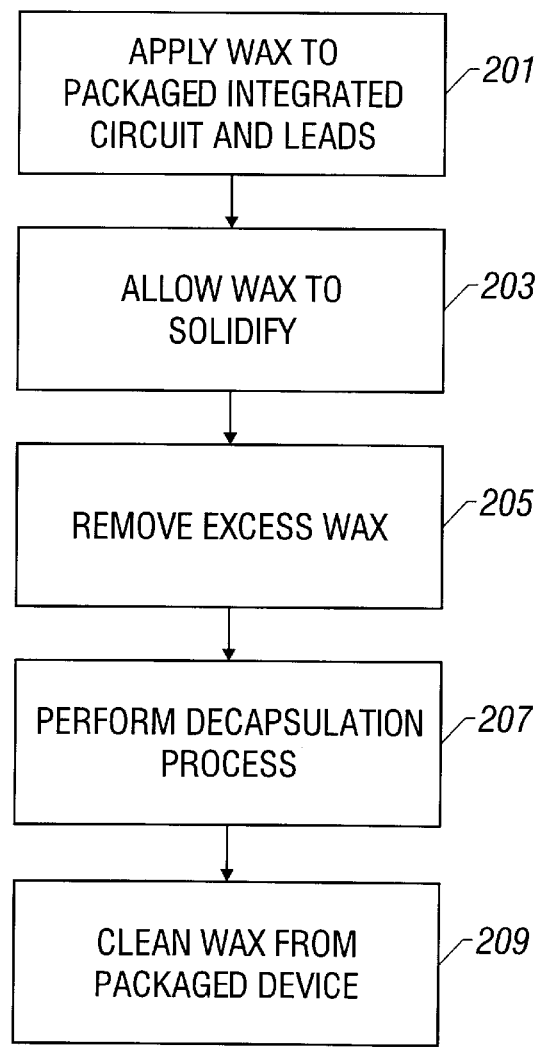
FIG. 2 shows a flow chart according to one embodiment of the invention.

Referring to FIG. 2, a flow chart according to one embodiment of the present invention is shown. In step 201, a composite material such as melted wax is applied to the leads of an integrated circuit. In step 203, the composite material is allowed to solidify around the pins, thus providing the pins increased rigidity and less susceptibility to deformation during handling. If excess material is present, the excess material may be removed in step 205 prior to the decapsulation process. In step 207, the decapsulation process is performed. While the decapsulation process is being performed, the wax provides protection from the fumes of the nitric acid utilized to etch away the plastic package. Once the decapsulation process is complete, the wax may be removed in step 209, in a manner as described in relation to FIG. 1.

Note that while the method of the present invention is particularly well suited for a decapsulation process involving plastic packages, the method may also provide added protection during processes involving other packaging technologies, e.g., ceramic packages.

The description of the invention set forth herein is illustrative, and is not intended to limit the scope of the invention as set forth in the following claims. Variations and modifications of the embodiments disclosed herein, may be made based on the descriptions set forth herein, without departing from the scope and spirit of the invention as set forth in the following claims.

What is claimed is:

1. A method of protecting leads of a packaged integrated circuit comprising:

applying a composite material to the leads of the packaged integrated circuit; and removing, while the composite material is coating the leads, at least a portion of a package containing the packaged integrated circuit to obtain access to the integrated circuit within the package;

wherein the composite material is wax.

2. The method as recited in claim 1 wherein the wax has thermal characteristics such that the wax provides protection for the leads during the removal of at least a portion of the package.

3. The method as recited in claim 1 wherein the wax is a bees wax.

4. The method as recited in claim 1, further comprising applying heat to the wax to obtain melted wax; and wherein the step of applying the composite material includes placing a portion of the packaged integrated circuit, the portion including the leads, in the melted wax.

5. A method of protecting leads of a packaged integrated circuit comprising:

applying a composite material to the leads of the packaged integrated circuit; and removing, while the composite material is coating the leads, at least a portion of a package containing the packaged integrated circuit to obtain access to the integrated circuit within the package;

removing the composite material from the leads after removal of the portion of the package, the removing of the composite material includes applying a cleaner.

6. The method as recited in claim 5 wherein the cleaner is at least one of acetone and isopropyl alcohol and a citric based cleaner.

7. A method of protecting leads of a packaged integrated circuit comprising:

applying a composite material to the leads of the packaged integrated circuit; and removing, while the composite material is coating the leads, at least a portion of a package containing the packaged integrated circuit to obtain access to the integrated circuit within the package;

removing the composite material from the leads after removal of the portion of the package, the removing the of composite material includes applying an output from an ultra sonic cleaner to the leads covered with the composite material.

8. A method of protecting leads of a packaged integrated circuit comprising:

applying a composite material to the leads of the packaged integrated circuit; and removing, while the composite material is coating the leads, at least a portion of a package containing the packaged integrated circuit to obtain access to the integrated circuit within the package;

removing the composite material from the leads after removal of the portion of the package, the removing of the composite material includes applying heat to the composite material.

9. The method as recited in claim 1 wherein the package is one of a plastic and ceramic package.

10. A method of protecting leads of an integrated circuit device contained within a package comprising:

coating the leads and a first portion of the package with melted paraffin;

allowing the paraffin to solidify around the leads and the first portion of the package;

removing a second portion of a package in a decapsulation process utilizing nitric acid while the paraffin is coating the leads, thereby providing access to the integrated circuit device within the package; and removing the paraffin from the leads after removing the second portion of the package.

11. The method as recited in claim 10, wherein the paraffin has thermal characteristics such that the paraffin provides protection for the leads at temperatures at least as high as a temperature of the nitric acid used in the decapsulation process.

12. The method as recited in claim 5 wherein the package is one of a plastic and ceramic package.

13. The method as recited in claim 7 wherein the package is one of a plastic and ceramic package.

14. The method as recited in claim 8 wherein the package is one of a plastic and ceramic package.

* * * * *